United States Patent
Wang et al.

(10) Patent No.: US 10,859,902 B2
(45) Date of Patent: Dec. 8, 2020

(54) LITHOGRAPHY MASK AND METHOD

(71) Applicant: Taiwan Semiconductor Manufacturing Company, Ltd., Hsinchu (TW)

(72) Inventors: Shiang-Bau Wang, Pingzchen (TW); Syun-Ming Jang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/567,729

(22) Filed: Sep. 11, 2019

(65) Prior Publication Data

US 2020/0004134 A1 Jan. 2, 2020

Related U.S. Application Data

(63) Continuation of application No. 15/816,393, filed on Nov. 17, 2017, now Pat. No. 10,481,483.

(60) Provisional application No. 62/527,808, filed on Jun. 30, 2017.

(51) Int. Cl.
| | |
|---|---|
| *G03F 1/24* | (2012.01) |
| *H01L 21/027* | (2006.01) |
| *G03F 1/46* | (2012.01) |
| *G03F 7/20* | (2006.01) |
| *G03F 1/76* | (2012.01) |
| *G03F 1/80* | (2012.01) |
| *G03F 1/52* | (2012.01) |
| *G03F 1/42* | (2012.01) |
| *G03F 1/40* | (2012.01) |

(52) U.S. Cl.
CPC ............... *G03F 1/24* (2013.01); *G03F 1/40* (2013.01); *G03F 1/42* (2013.01); *G03F 1/46* (2013.01); *G03F 1/52* (2013.01); *G03F 1/76* (2013.01); *G03F 1/80* (2013.01); *G03F 7/2008* (2013.01); *H01L 21/0276* (2013.01)

(58) Field of Classification Search
CPC ...... G03F 1/24; G03F 1/40; G03F 1/42; G03F 1/46; G03F 1/52; G03F 1/76; G03F 1/80; G03F 7/2008; H01L 21/0276
USPC .............................................................. 430/5
See application file for complete search history.

(56) References Cited

U.S. PATENT DOCUMENTS

| | | | |
|---|---|---|---|
| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |

*Primary Examiner* — Christopher G Young
(74) *Attorney, Agent, or Firm* — Slater Matsil, LLP

(57) ABSTRACT

In an embodiment, a photomask includes: a substrate over a first conductive layer, the substrate formed of a low thermal expansion material (LTEM); a second conductive layer over the first conductive layer; a reflective film stack over the substrate; a capping layer over the reflective film stack; an absorption layer over the capping layer; and an antireflection (ARC) layer over the absorption layer, where the ARC layer and the absorption layer have a plurality of openings in a first region exposing the capping layer, where the ARC layer, the absorption layer, the capping layer, and the reflective film stack have a trench in a second region exposing the second conductive layer.

20 Claims, 14 Drawing Sheets

LITHOGRAPHY MASK AND METHOD

PRIORITY CLAIM AND CROSS-REFERENCE

This application is a continuation of U.S. patent application Ser. No. 15/816,393, filed on Nov. 17, 2017, which claims the benefit of U.S. Provisional Application No. 62/527,808, filed on Jun. 30, 2017, which applications are hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, the need to perform higher resolution lithography processes grows. Some next-generation lithography techniques being explored include extreme ultraviolet (EUV) lithography, deep ultraviolet (DUV) lithography, X-ray lithography, soft X-ray (SX) lithography, ion beam projection lithography, electron-beam projection lithography, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
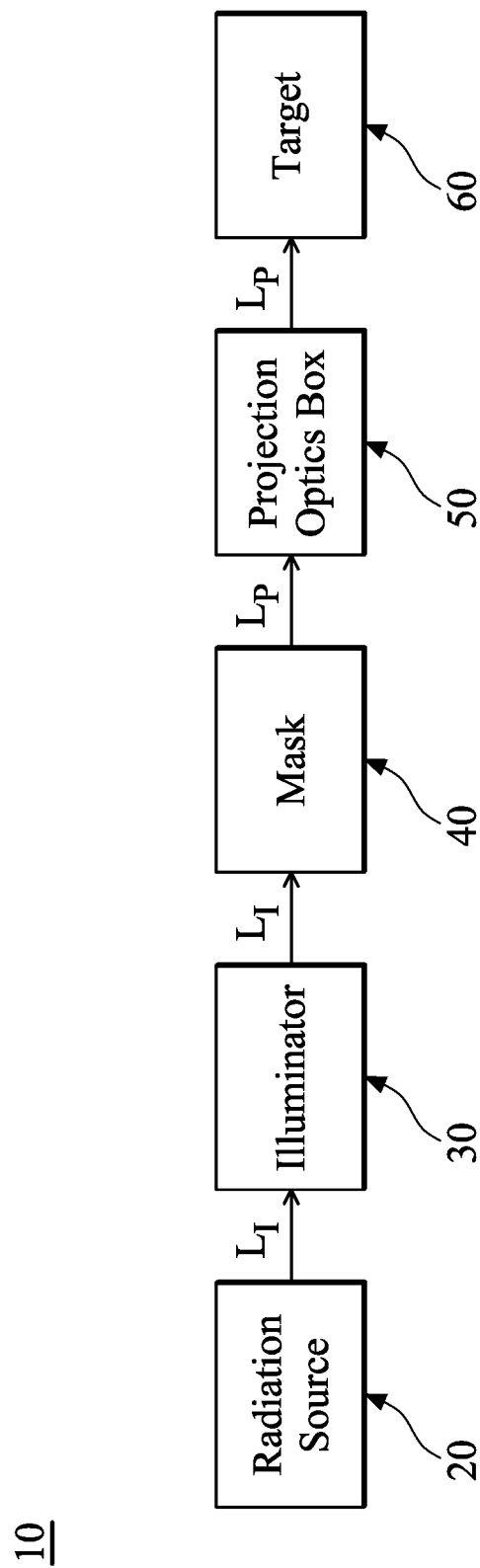
FIG. 1 is a block diagram of a lithography system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A lithography mask and method are provided, in accordance with some embodiments. In particular, a mask for a reticle is formed. The mask includes a reflective film stack over a substrate and an absorptive film stack over the reflective film stack. The absorptive film stack is patterned to have features corresponding to features being formed in a target. A trench is formed in the absorptive and reflective film stacks around the features. A conductive material is exposed at the bottom of the trench. The conductive material neutralizes differences in potential that may occur along the bottom of the trench due to the photoelectric effect. Neutralizing differences in potential may prevent arcing, reducing the amount of particles formed on the mask as a result of particle discharge caused by the arcing.

FIG. 1 is a block diagram of a lithography system 10, in accordance with some embodiments. The lithography system 10 includes a radiation source 20, an illuminator 30, a mask 40, a projection optics box (POB) 50, and a target 60. Other configurations and inclusion or omission of devices may be possible. In an embodiment, the lithography system 10 is an extreme ultraviolet (EUV) lithography system. In other embodiments, the lithography system 10 is a DUV lithography system, a X-ray lithography system, a soft X-ray (SX) lithography system, an ion beam projection lithography system, an electron-beam projection lithography system, or the like.

The electromagnetic radiation produced by the lithography system 10 may cause ionization of the atmosphere of the lithography system 10. As such, components of the lithography system 10 may be operated under vacuum atmosphere, or an atmosphere with a plasma or gas that does not ionize. In embodiments where the lithography system 10 is an EUV lithography system, components of the lithography system 10 are operated under an atmosphere of $H_2$ plasma.

The radiation source 20 provides electromagnetic radiation having a wavelength in a desired range. An incident radiation beam $L_I$ is produced by the radiation source 20, may be generated by a plasma source, a laser induced source, an electrical discharge gas plasma source, or the like. Example plasma sources include xenon, oxygen, lithium, and the like. The plasma may be a high-temperature and high-density plasma, and may be laser-produced plasma (LPP) or discharge-produced plasma (DPP). In embodiments where the lithography system 10 is an EUV lithography system, the radiation source 20 produces EUV radiation with a plasma source, such as radiation having a wavelength of from about 1 nm to about 100 nm, such as a wavelength centered at about 13.5 nm.

The illuminator 30 includes various optic components to condense radiation from the radiation source 20 and direct the incident radiation beam $L_I$ onto the mask 40. The illuminator 30 may include refractive optic components, such as a single lens or a lens system having multiple lenses (zone plates), or reflective optic components, such as a single mirror or a mirror system having multiple mirrors. In embodiments where the lithography system 10 is an EUV lithography system, the illuminator 30 includes reflective optic components. In an embodiment, the illuminator 30 is operable to configure the reflective optic components to provide off-axis illumination (OAI) to the mask 40. In some embodiments, the mirrors of the illuminator 30 are switchable to reflect the EUV radiation of the incident radiation beam $L_I$ to different illumination positions. In another embodiment, a stage (not shown) prior to the illuminator 30 may additionally include other switchable mirrors that are controllable to direct the EUV radiation of the incident radiation beam $L_I$ to different illumination positions with the mirrors of the illuminator 30.

The mask 40 patterns the incident radiation beam $L_I$ with a pattern that will be formed in a photosensitive layer (not shown, described below) disposed on the target 60, thereby producing a patterned radiation beam $L_P$. For example, circuit patterns (e.g., the design of a layer of an integrated circuit (IC) device or chip) may be formed on the mask 40. The mask 40 is then used to transfer the circuit patterns onto the target 60. The patterns may be transferred repeatedly onto multiple wafers through various lithography processes. Several masks 40 (for example, a set of 15 to 30 masks) may be used to pattern a complete IC device on the target 60. The mask 40 may be held by a chuck (not shown).

The mask 40 may be a transmissive mask, a reflective mask (sometimes referred to as a "reticle"), an optical proximity correction (OPC) mask, or the like. In embodiments where the lithography system 10 is an EUV lithography system, the mask 40 is a reflective mask. The reflective mask may be a binary intensity mask (BIM) or a phase-shifting mask (PSM). A BIM includes an almost totally absorptive region (also referring to as an opaque region) and a reflective region. In the opaque region, an absorber is present and the incident radiation beam $L_I$ is almost fully absorbed by the absorber. In the reflective region, the absorber is removed and the incident radiation beam $L_I$ is reflected by a multilayer (ML). A PSM includes an absorptive region and a reflective region. A portion of the incident radiation reflects from the absorptive region with a proper phase difference with respect to reflected radiation from the reflective region to enhance the resolution and imaging quality. The PSM can be an attenuated PSM (AttPSM) or alternating PSM (AltPSM). An AttPSM usually has 2%-15% of reflectivity from its absorber, while an AltPSM usually has larger than 50% of reflectivity from its absorber.

In some embodiments, a pellicle (not shown) is formed on the mask 40. The pellicle is a thin film on a frame that covers a patterned surface of the mask 40 and protects the surface of the mask 40 from dust or particles. The pellicle may be omitted in embodiments where the pellicle would absorb excessive radiation and generate heat, such as embodiments where the lithography system 10 is an EUV lithography system.

The POB 50 collects the patterned radiation beam $L_P$ reflected from (or transmitted by) the mask 40 and projects it onto the target 60. The POB 50 may magnify the patterned radiation beam $L_P$, and may magnify the patterned radiation beam $L_P$ with a magnification of less than one, thereby reducing the patterned image of the patterned radiation beam $L_P$. The POB 50 may include refractive or reflective optics. In an embodiment, the POB 50 includes reflective optics such as mirrors (not shown).

The target 60 may be a target substrate having a photosensitive layer disposed thereon. The target substrate may be, e.g., a semiconductor wafer, an may be formed from semiconductors such as silicon, germanium, the like, or a combination thereof. Alternatively, the target substrate may include a compound semiconductor and/or an alloy semiconductor. Further, the target substrate may optionally include an epitaxial layer (epi layer), may be strained for performance enhancement, may include a silicon-on-insulator (SOI) structure, and/or have other suitable enhancement features. The target substrate may include a plurality of dies formed or partially formed thereon. Each die may include any number of semiconductor devices, such as field effect transistors (FETs), capacitors, resistors, conductive interconnects, and/or other suitable devices. The target substrate may include various doped regions or regions of the target substrate (including layers on semiconductor wafer) with suitable N-type or P-type dopants (impurities). Exemplary regions include active regions on which MOS devices can be formed; the active regions may be doped to form well regions. The doped regions, including but not limited to active regions, may vary in dimension, dopant level, configuration, and/or other properties. The boundaries of the active regions may be defined by isolation structures such as shallow trench isolation (STI) features. The photosensitive layer (e.g., photoresist or resist), is a material that is sensitive to the radiation of the patterned radiation beam $L_P$, and may include a positive tone resist or a negative tone resist. The photosensitive layer may be formed on the target substrate by spin-on coating, soft baking, or combinations thereof.

FIGS. 2 through 6 illustrate intermediate steps in the manufacturing of the mask 40, in accordance with some embodiments. FIGS. 2 through 6 are cross-sectional views. Manufacturing of the mask 40 includes a blank mask fabrication process and a mask patterning process. During the blank mask fabrication process, a blank mask 40 is formed by deposing suitable layers (e.g., multiple reflective layers) on a suitable substrate. The blank mask 40 is patterned during the mask patterning process to form a patterned mask 40 having a design of a layer of an IC device. In the embodiments shown, the mask 40 is a reflective mask used as a reticle for an EUV lithography system. It should be appreciated that similar techniques such may be used to manufacture other types of masks.

Figure 2:
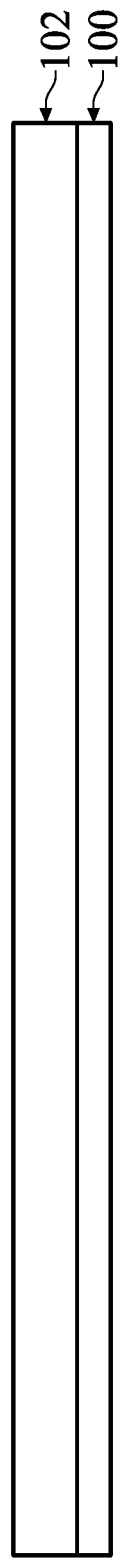
FIGS. 2, 3, 4, 5, and 6 illustrate intermediate steps in the manufacturing of a mask, in accordance with some embodiments.

In FIG. 2, a low thermal expansion material (LTEM) substrate 102 is formed on a conductive layer 100. The conductive layer 100 may be disposed on a chuck (not shown), and may be formed of chromium nitride (CrN) or the like. The LTEM substrate 102 is formed of a material that does not significantly expand when heated, thereby reducing image distortion that may occur from heating of the mask 40. The LTEM substrate 102 may be formed from glass, quartz, silicon, silicon carbide, silicon oxide, doped silicon oxide, titanium oxide, black diamond, the like, or combinations thereof. The LTEM substrate 102 may be formed by a deposition process such as physical vapor deposition (PVD), chemical vapor deposition (CVD), low pressure CVD (LP-CVD), plasma enhanced CVD (PECVD), or the like.

Figure 3:
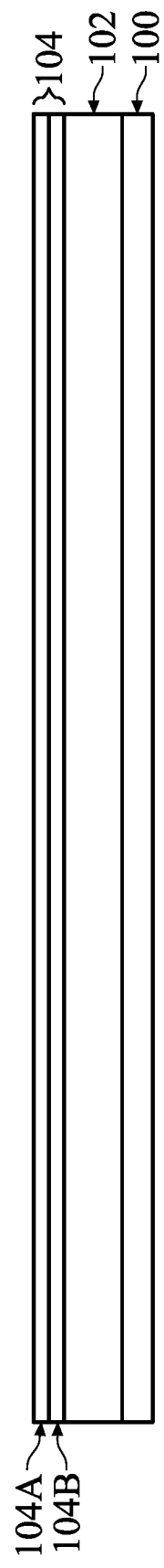

In FIG. 3, a conductive film stack 104 is formed over the LTEM substrate 102. The conductive film stack 104 may be a multilayer film that includes one or more layers of conductive material, or may be a single layer of conductive material. In the embodiment shown, the conductive film stack 104 includes conductive layers 104A and 104B. Each layer of the conductive film stack 104 may be formed from a conductor or a semiconductor. In some embodiments, each layer of the conductive film stack 104 may be formed of chromium, tantalum, tantalum boron, the like, or combinations thereof, and may be doped with elements such as B, P, O, N, As, the like, or combinations thereof. For example, the conductive layer 104A may be formed from TaBN, TaBO, TaBON, low-reflectivity TaBON (LR-TaBON), CrN, CrON, $Cr_xO_y$, ITO, or $Ta_xO_y$, and may be formed by a deposition process such as CVD, atomic layer deposition (ALD), plasma enhanced ALD (PEALD), PVD, or the like. The conductive layer 104B may be formed of a material selected from the same candidate material of the conductive layer 104A, and may be formed using a method that is selected from the same group of candidate methods for forming the conductive layer 104A. The conductive layers 104A and 104B may be formed of the same material, or may include different materials. Doping the layers of the conductive film stack 104 results in a film stack that absorbs EUV and DUV radiation, and has a low electrical resistivity. In an embodiment, the electrical resistivity of the doped conductive film stack 104 is less than about 1000 ohms at a temperature of about 20° C. In other embodiments, the conductive film stack 104 is a single layer of doped conductive material.

Figure 4:
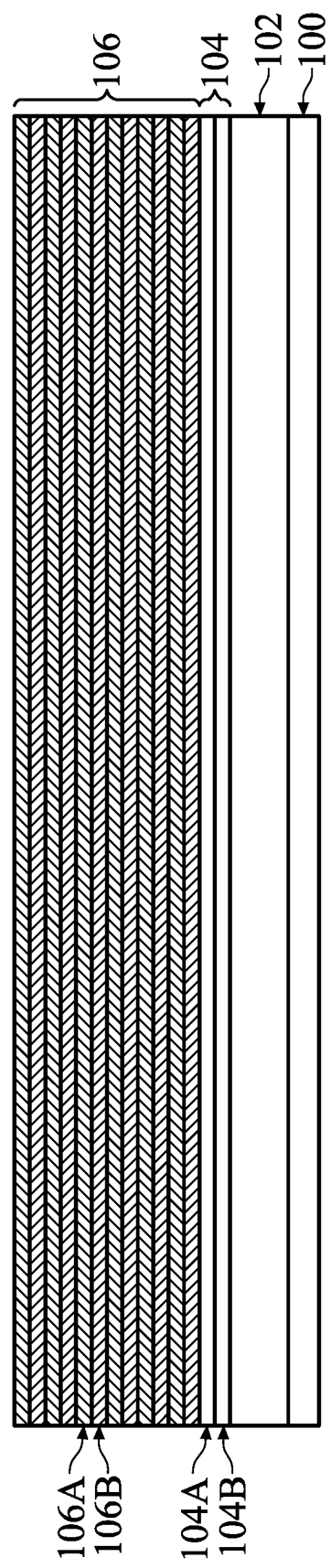

In FIG. 4, a reflective film stack 106 is formed over the conductive film stack 104; a bottommost layer of the reflective film stack 106 may (or may not) physically contact a topmost layer of the conductive film stack 104. The reflective film stack 106 is a multilayer film and includes alternating layers of a high refractive index film 106A and a low refractive index film 106B. The high refractive index film 106A is formed of a material that has a tendency to scatter EUV radiation, and the low refractive index film 106B is formed of a material that has a tendency to transmit EUV radiation; alternating a plurality of film pairs with different refractive indices provides a resonant reflectivity for the reflective film stack 106. The films 106A and 106B may be formed of materials selected such that the reflective film stack 106 has resonant reflectivity for a selected radiation type and/or wavelength used in an associated lithography process. The films 106A and 106B of the film pairs may be molybdenum-beryllium (Mo—Be) film pairs, molybdenum-silicon (Mo—Si) film pairs, or the like. The reflective film stack 106 may have a reflectivity as high as 70% reflectivity relative a selected radiation type/wavelength.

The thickness of each of the films 106A and 106B and the overall thickness of the reflective film stack 106 depends on the wavelength of the radiation used in the lithography process, and the incident angle of the incident radiation beam $L_I$. In an embodiment, the film 106A is formed of molybdenum having a thickness of from about 2.8 nm to about 5 nm, and the film 106B is formed of silicon having a thickness of from about 4.1 nm to about 6 nm, although other thicknesses of the films are contemplated. In an embodiment, the number of the film pairs in the reflective film stack 106 ranges from 20 to 80 pairs, for a total thickness of the reflective film stack 106 of from about 138 nm to about 880 nm, although other quantities of film pairs are contemplated.

Figure 5:
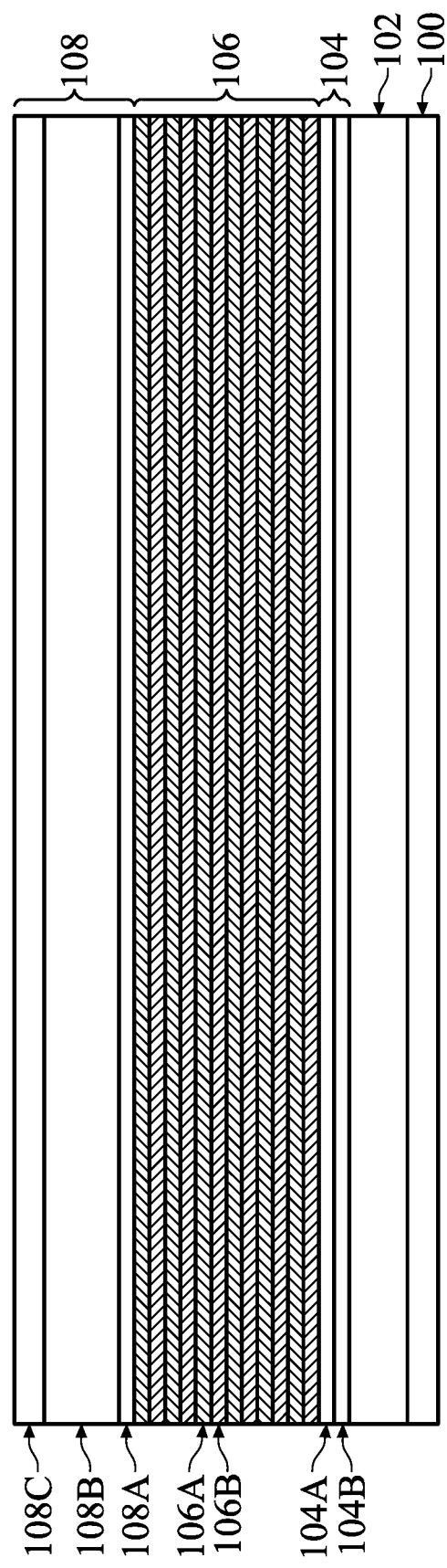

In FIG. 5, an absorptive film stack 108 is formed over the reflective film stack 106. The absorptive film stack 108 is formed in embodiments where the mask 40 is a BIM, and includes one or more absorption materials for the incident radiation beam $L_I$ relative to the incident radiation reflected by the reflective film stack 106. In the embodiment shown, the absorptive film stack 108 includes a capping layer 108A, an absorption layer 108B, and an antireflection (ARC) layer 108C. In embodiments where the mask 40 is a PSM, a phase-shifting film stack (not shown) may instead formed over the reflective film stack 106 from one or more phase-shifting materials for the incident radiation beam $L_I$ relative to the incident radiation reflected by the reflective film stack 106.

The capping layer 108A is formed on the reflective film stack 106, and prevents oxidation of the reflective film stack 106 during a subsequent mask patterning process and a subsequent repair process for the absorptive film stack 108. In addition, the capping layer 108A acts as an etch stop in a subsequent patterning process for the absorptive film stack 108. As such, the capping layer 108A has different etch characteristics than the absorption layer 108B relative a same etching process. The capping layer 108A may be formed from ruthenium, ruthenium boron, ruthenium silicon, chromium, chromium oxide, chromium nitride, silicon dioxide, amorphous carbon, the like, or combinations thereof, and may be formed by a deposition process such as low temperature deposition, CVD, PVD, or the like. In an embodiment, the capping layer 108A may be formed to a thickness of from about 20 nm to about 80 nm, and may be formed by a low temperature deposition process, thereby reducing or avoiding interdiffusion with the reflective film stack 106; the low temperature deposition process may be performed at a temperate of less than about 450° C.

The absorption layer 108B is formed on the capping layer 108A. The absorption layer 108B absorbs the selected radiation type/wavelength projected onto the patterned mask 40 during the lithography process, and may be the primary absorbing layer of the absorptive film stack 108. The absorption layer 108B may be formed from a conductive material such as chromium, chromium oxide, tantalum, titanium nitride, tantalum boron nitride, tantalum boron oxide, titanium, aluminum-copper chromium, the like, multilayers thereof, or alloys thereof. In an embodiment, the absorption layer 108B is formed of a dual layer of chromium and tantalum nitride. In another embodiment, the absorption layer 108B and one of the conductive layers 104A and 104B are formed of the same material. The absorption layer 108B may be formed by PVD, CVD, atmospheric pressure CVD (APCVD), LPCVD, PECVD, high density plasma CVD (HDP CVD), ion beam deposition, spin-on coating, a sputtering process, or the like, and may be formed to any suitable thickness for a given material to achieve adequate absorption.

The ARC layer 108C is formed above the absorption layer 108B. In embodiments where the lithography system 10 is an EUV lithography system, the ARC layer 108C reduces reflection of incident radiation having a wavelength shorter than the DUV range from the absorption layer 108B. The ARC layer 108C may be formed from compound materials such as TaO, TaBO, $Cr_2O_3$, ITO, $SiO_2$, SiN, $TaO_5$, the like or a combination thereof, and may be formed by a deposition processes such as PVD, CVD, LPCVD, PECVD, or the like.

Figure 6:
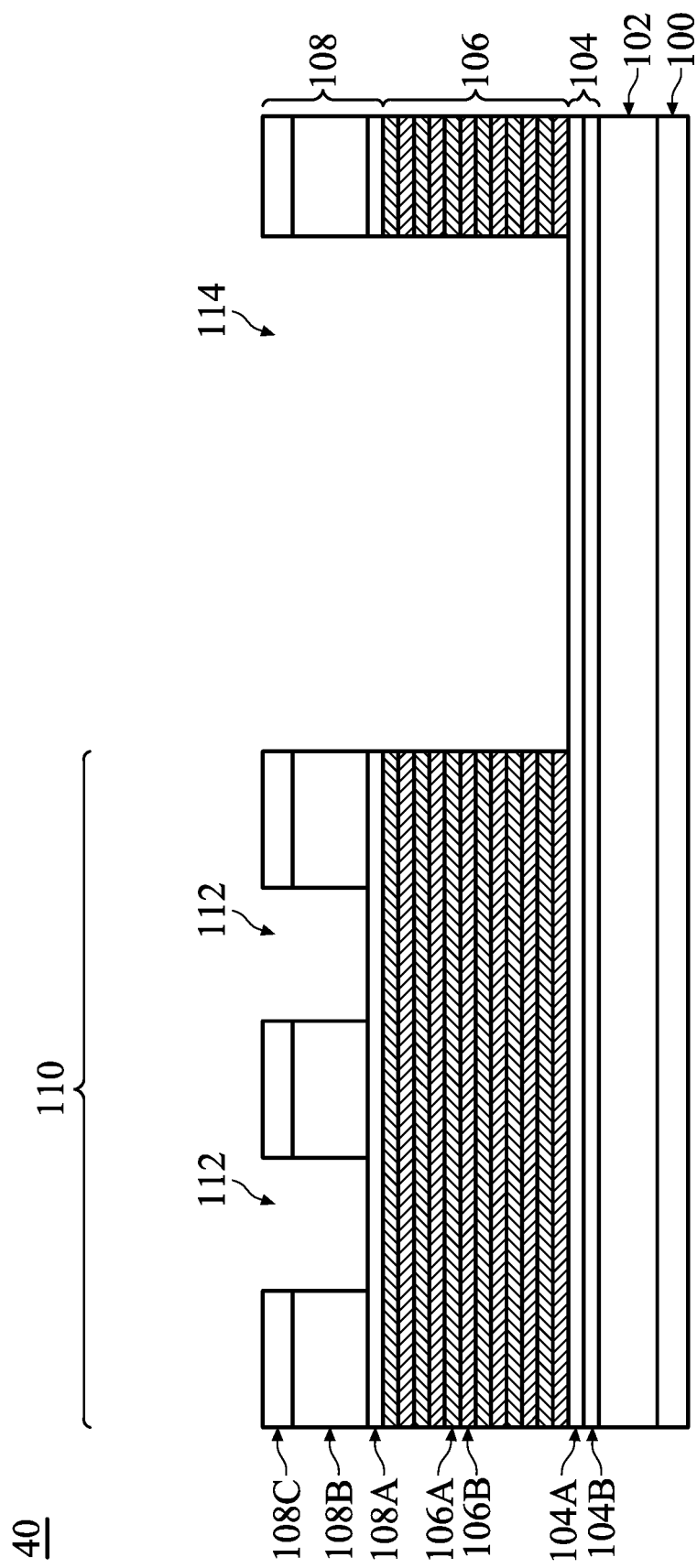

In FIG. 6, the ARC layer 108C and absorption layer 108B are patterned in a first region of the mask 40 to form a design layout pattern 110 corresponding to the layer of the IC device being formed. The ARC layer 108C and absorption layer 108B may be patterned using acceptable photolithography and etching techniques. As an example to patterning the ARC layer 108C and absorption layer 108B, a photoresist may be formed over the ARC layer 108C and absorption layer 108B, and the photoresist may be patterned with a pattern corresponding to the design layout pattern for the IC. An etching process, such as a dry or wet etch, may be performed to transfer the pattern of the photoresist to the ARC layer 108C and absorption layer 108B; the capping layer 108A may act as an etch stop layer during the etching process. Openings 112 may thereby be formed in the ARC layer 108C and absorption layer 108B exposing the capping layer 108A.

Further in FIG. 6, trenches 114 are formed in the capping layer 108A and reflective film stack 106, in a second region of the mask 40, thereby exposing the conductive film stack 104. As further shown below, the trenches 114 are formed around the mask 40 such that they surround the design layout pattern 110 of the mask 40. The trenches 114 may be referred to as forming a "black border," and forms a clear edge that may be used as an alignment mark when the incident radiation beam $L_I$ is projected onto the target 60. The openings 112 and trenches 114 may be formed in any order, using different lithography masks. In the embodiment shown, the openings 112 are formed before the trenches 114. As an example of forming the trenches 114 after the openings 112, a photoresist may be formed over the ARC layer 108C and absorption layer 108B and in the openings 112. The photoresist may be patterned with a pattern corresponding to the trenches 114. An etching process, such as a dry or wet etch, may be performed to transfer the pattern of the photoresist to the capping layer 108A and reflective film stack 106. In other embodiments, the openings 112 are formed before the trenches 114. As an example of forming the openings 112 before the trenches 114, a photoresist may be formed over the ARC layer 108C and absorption layer 108B and in the trenches 114. The photoresist may be patterned with a pattern corresponding to the openings 112. An etching process, such as a dry or wet etch, may be performed to transfer the pattern of the photoresist to the capping layer 108A and reflective film stack 106.

Figure 7A:
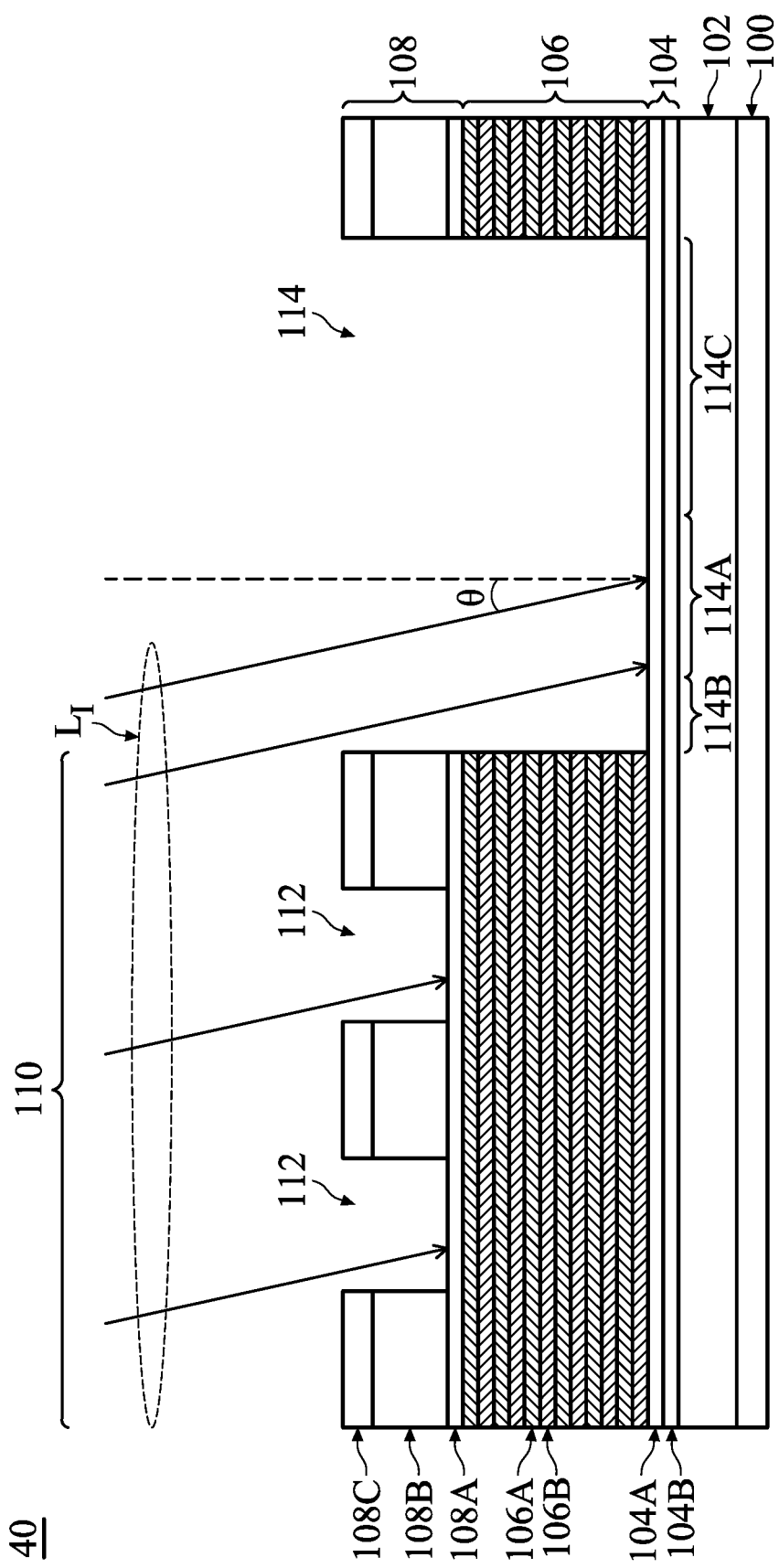
FIGS. 7A and 7B illustrate a mask during use in a lithography system, in accordance with some embodiments.
Figure 7B:
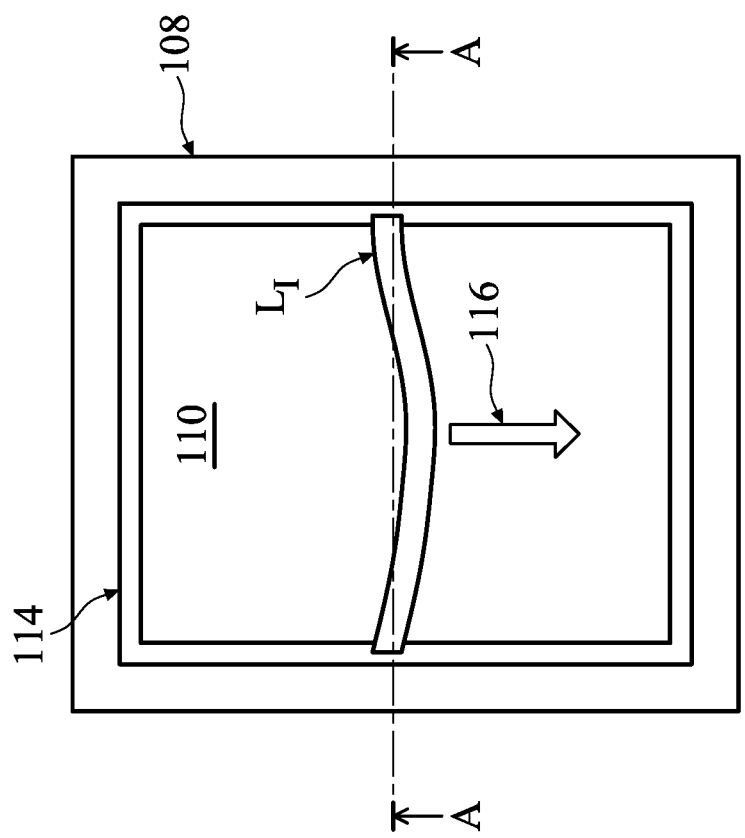

FIGS. 7A and 7B illustrate the mask 40 during use in the lithography system 10, in accordance with some embodiments. FIG. 7A is a cross-sectional view of the mask 40, and FIG. 7B is a top-down view of the mask 40. FIG. 7A is shown along the A-A line of FIG. 7B. During operation, the incident radiation beam $L_I$ is projected towards the mask 40. Portions of the incident radiation beam $L_I$ that strike conductive features, such as the exposed pattern of the reflective film stack 106, are reflected by the mask 40. Portions of the incident radiation beam $L_I$ that strike absorptive features, such as the absorption layer 108B are absorbed and are not reflected by the mask 40.

The incident radiation beam $L_I$ is projected towards the mask 40 at an angle θ with a vertical line extending from a major surface of the LTEM substrate 102. As a result, some portions of the mask 40 may be illuminated by the incident radiation beam $L_I$, and other portions of the mask 40 may not be illuminated. For example, the black border 114 may have portions 114A illuminated by the incident radiation beam $L_I$, and other portions 114B that are not illuminated, as a result of shadows cast by the edges of the reflective film stack 106. In embodiments where the lithography system 10 is an EUV lithography system, the angle θ may be less than 90 degrees, such as in a range of from about 1 degree to about 11 degrees.

The illuminator 30 is operable to scan the incident radiation beam $L_I$ over the mask 40 in a direction 116. The incident radiation beam $L_I$ is scanned over the design layout pattern 110 within the boundaries of the black border 114. As can be seen in FIG. 7B, the incident radiation beam $L_I$ may partially overlap the black border 114 during scanning. As such, the black border 114 may have portions 114C that are not illuminated because they are not scanned with the incident radiation beam $L_I$. As further shown in FIG. 7B, the incident radiation beam $L_I$ may not be a perfectly shaped beam, and may in fact have a poorly defined boundary.

The electromagnetic radiation produced by the radiation source 20 may have a high photon energy. In embodiments where the lithography system 10 is an EUV lithography system, the radiation may have photon energy as high as 92 eV. Due to the photoelectric effect, projecting the high energy incident radiation beam $L_I$ on the mask 40 may induce a positive charge on surfaces of the mask 40 that are illuminated by the incident radiation beam $L_I$. In particular, partially illuminating materials along the bottom of the black border 114 with a high energy radiation beam may ordinarily cause the illuminated portions 114A to be at a higher potential than the unilluminated portions 114B and 114C. However, the conductive film stack 104 over the LTEM substrate 102 acts as a grounding layer, neutralizing such differences in potential at the bottom of the black border 114. Reducing differences in potential on the surfaces of the mask 40 may avoid arcing across such potential differences. Arcing may occur between portions of a same partially illuminated surface, or between different partially illuminated surfaces. Reducing arcing between the sides of the black border (e.g., the reflective film stack 106) and the bottom of the black border may reduce the quantity of Mo that would otherwise be discharged from the reflective film stack 106 as a result of arcing. Reducing particle discharge is particularly advantageous, as discharged Mo may congregate into particles, absorbing some of the incident radiation beam $L_I$ and altering the design layout pattern transferred to the target 60. Further, the conductive film stack 104 may be relatively thin compared to the LTEM substrate 102. In an embodiment, the conductive film stack 104 may have a thickness of from about 10 nm to about 1000 nm, and may be from about $1.6*10^{-4}$% to about $1.6*10^{-2}$% of the thickness of the LTEM substrate 102. As such, the substrate that the mask 40 is formed on (e.g., the LTEM substrate 102), may retain its low thermal expansion properties, and the trenches 114 may retain their absorptive properties.

Figure 8:
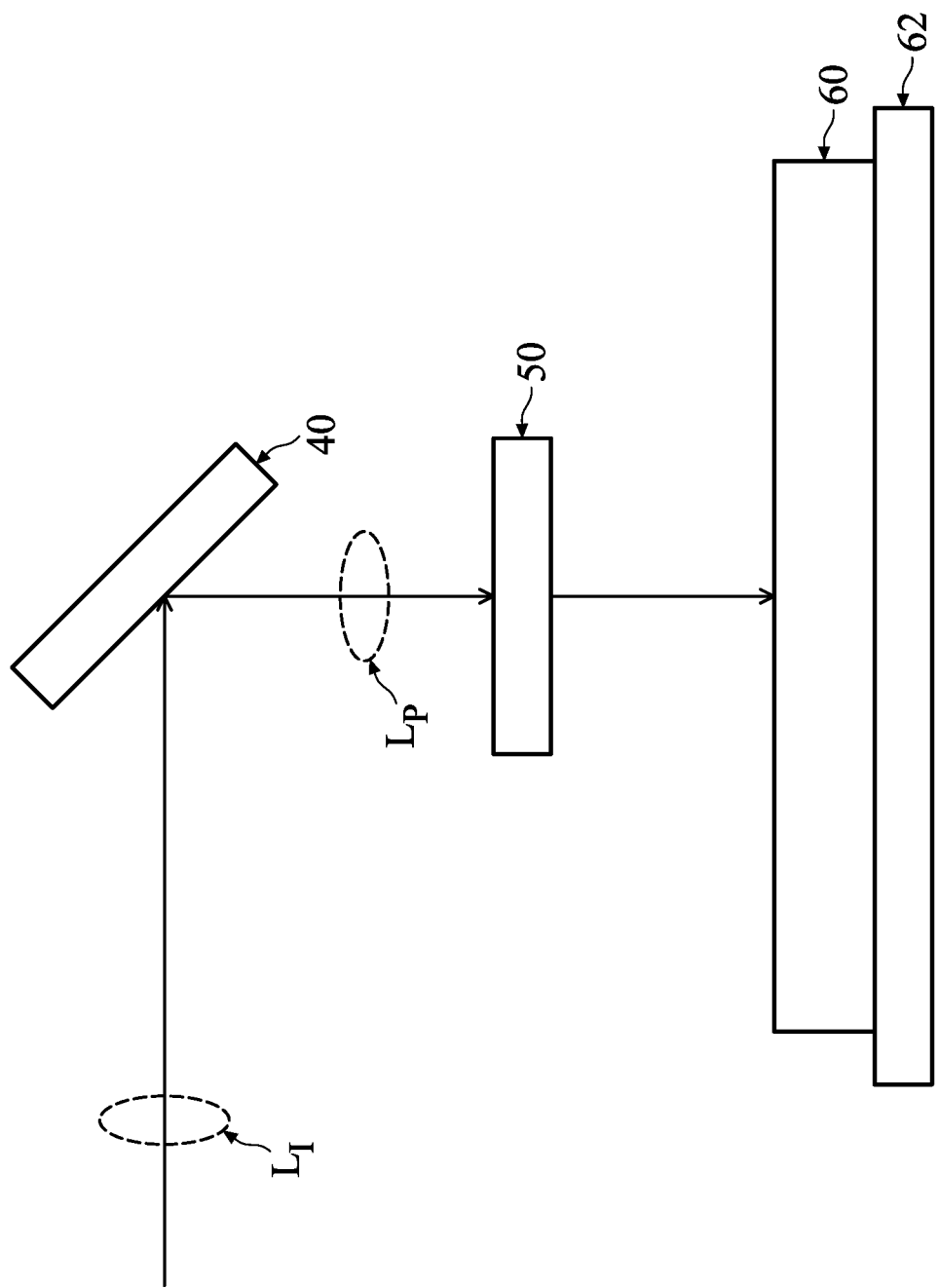
FIG. 8 illustrates exposure of a target during use in a lithography system, in accordance with some embodiments.

FIG. 8 illustrates exposure of the target 60 during use in the lithography system 10, in accordance with some embodiments. During operation, the portions of the incident radiation beam $L_I$ reflected by the mask 40 are projected on the target 60 by the POB 50. The target 60 may be held by a target substrate stage 62, which provides control of the position of the target 60 such that the image of the mask 40 may be scanned onto the target substrate in a repetitive fashion. As noted above, the target 60 includes a photosensitive layer on a target substrate.

When the photosensitive layer is exposed to the patterned radiation beam $L_P$ from the mask 40, it reacts to form an image in the photosensitive layer corresponding to the design layout pattern of the mask 40. A developer solution (not shown) may be applied to the exposed regions of the photosensitive layer to develop the photosensitive layer into a patterned structure (not shown). The patterned photosensitive layer may be used as an etch mask in an etching process to pattern the target substrate with the design layout pattern of the photosensitive layer. The etching process may include a dry etch, a wet etch, and/or other etching methods. After the etching process, the patterned photosensitive layer may be removed by a suitable technique, such as stripping or ashing. The design layout pattern formed on the mask 40 is thereby transferred to the target substrate, thereby forming features on the target substrate. The features may be, e.g., semiconductor fins, gate stacks, metallization layers, interconnects, and the like.

Figure 9:
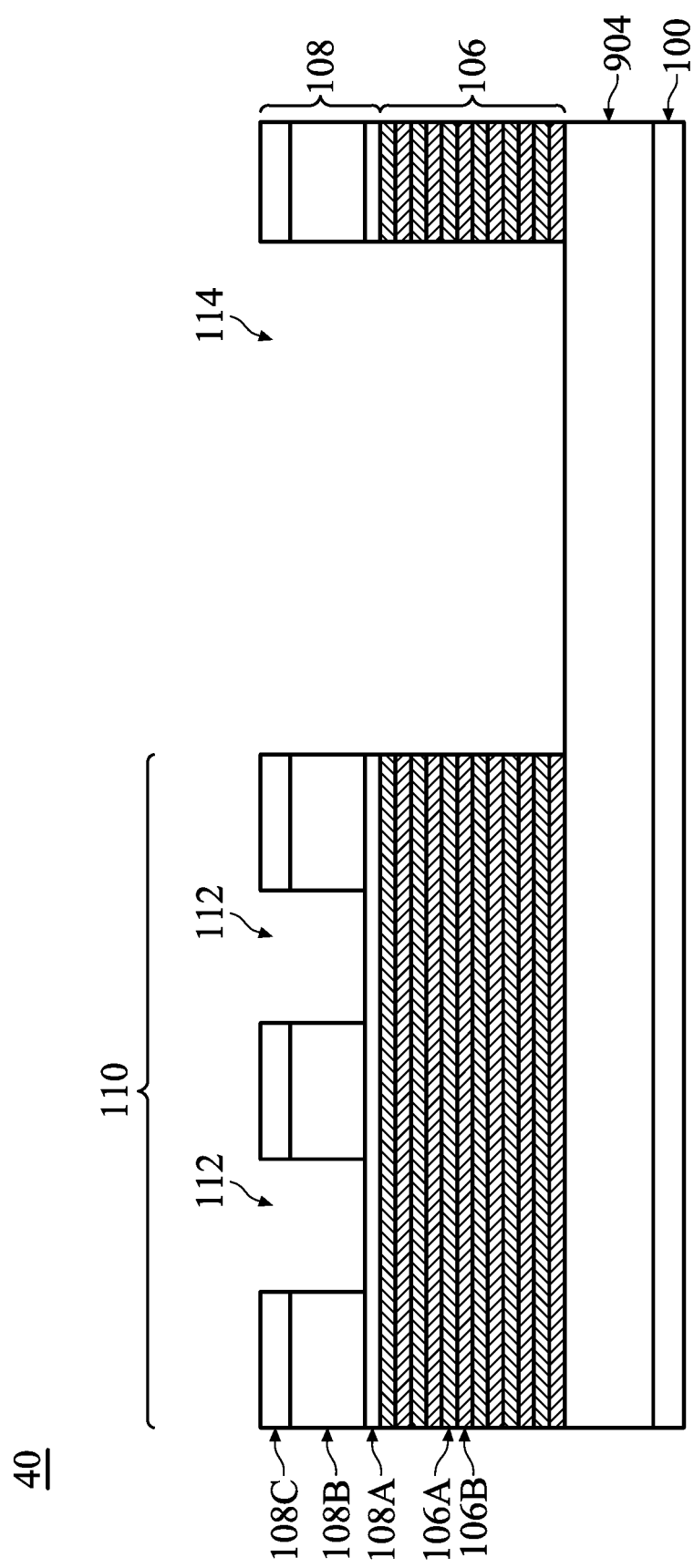
FIG. 9 illustrates a mask, in accordance with some other embodiments.

FIG. 9 illustrates the mask 40, in accordance with some other embodiments. In the embodiment shown in FIG. 9, the LTEM substrate 102 is omitted, and a single conductive layer 904 is formed on the conductive layer 100. The reflective film stack 106 is formed over the conductive layer 904. The conductive layer 904 may be formed from silicon, silicon carbide, graphite, or the like, and may be formed by a suitable deposition process such as CVD, LPCVD, or the like. The conductive layer 904 may be doped with elements such as B, P, As, metals, the like, or combinations thereof, to form a film having good EUV and DUV absorption and an electrical resistivity of less than about 1000 ohms at a temperature of about 20° C.

Figure 10:
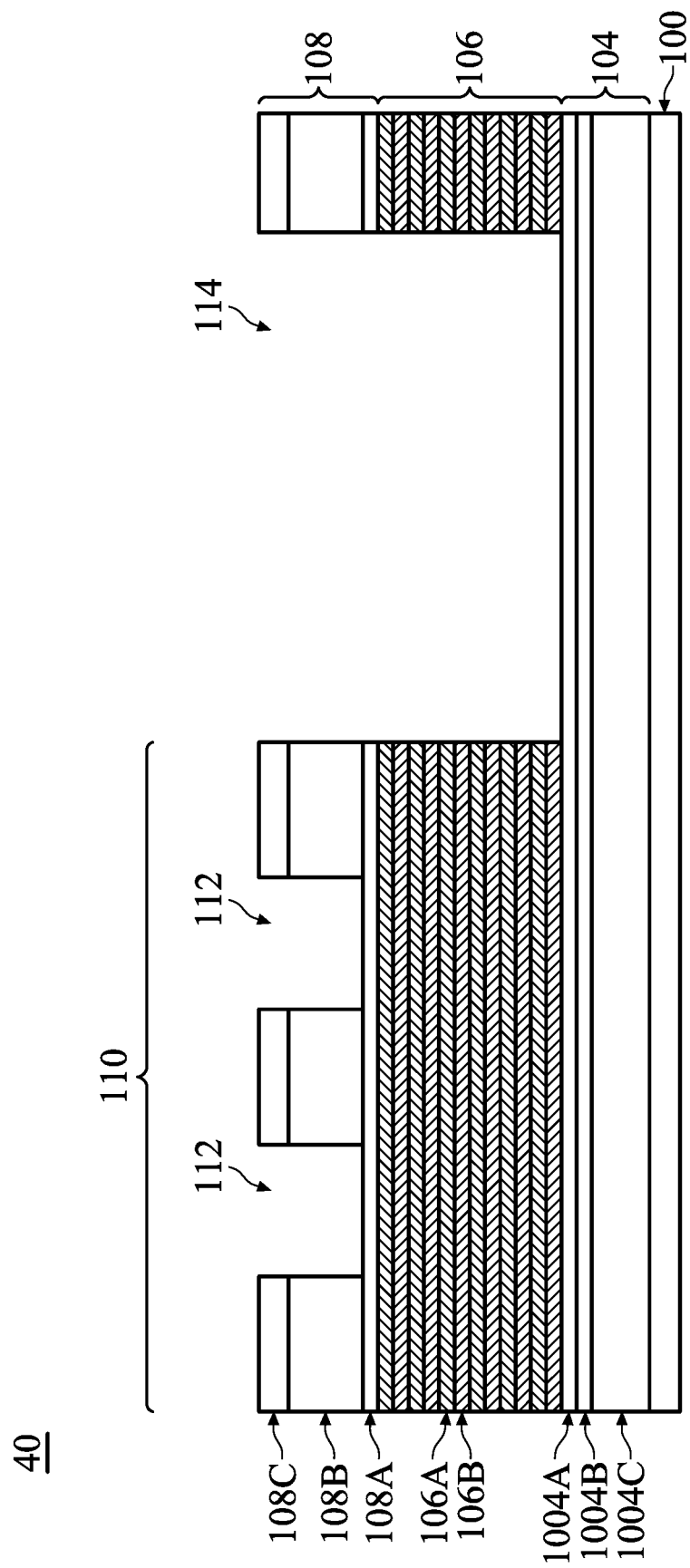
FIG. 10 illustrates a mask, in accordance with some other embodiments.

FIG. 10 illustrates the mask 40, in accordance with some other embodiments. In the embodiment shown in FIG. 10, the LTEM substrate 102 is omitted, and the conductive film stack 104 is formed on the conductive layer 100. The conductive film stack 104 may include three conductive layer, such as conductive layer 1004A, 1004B, and 1004C. The conductive layers 1004A and 1004B may be formed of a material selected from the same candidate material of the conductive layers 104A and 104B, and may be formed using a method that is selected from the same group of candidate methods for forming the conductive layers 104A and 104B. The conductive layer 1004C may be formed of a material selected from the same candidate material of the conductive layer 904, and may be formed using a method that is selected from the same group of candidate methods for forming the conductive layer 904.

Figure 11:
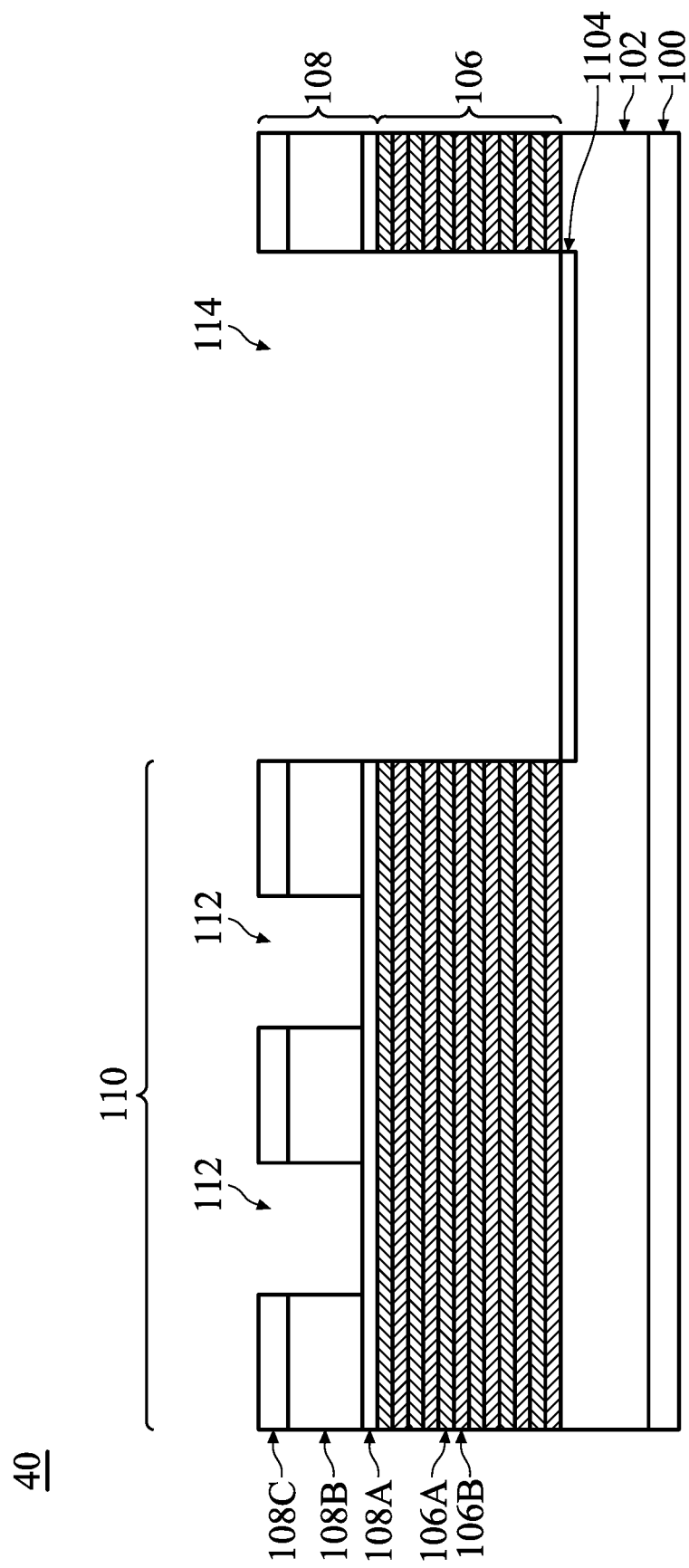
FIG. 11 illustrates a mask, in accordance with some other embodiments.

FIG. 11 illustrates the mask 40, in accordance with some other embodiments. In the embodiment shown in FIG. 11, the conductive film stack 104 is omitted, and the reflective film stack 106 is formed on the LTEM substrate 102; a bottommost layer of the reflective film stack 106 may (or may not) physically contact the LTEM substrate 102. A conductive layer 1104 is formed in a top surface of the LTEM substrate 102 by, e.g., implanting dopants in the LTEM substrate 102 at bottoms of the trenches 114. The implanting may be performed by appropriate photolithography and implanting techniques. A photoresist may be formed over the mask 40, and may be patterned with openings corresponding to the trenches 114. The photoresist may be the same photoresist used to etch the trenches 114. Dopants may then be implanted in the exposed surface of the LTEM substrate 102. The dopants may be elements such as B, P, or the like. After the implanting, the conductive layer 1104 of the LTEM substrate 102 may be sufficiently conductive to neutralize potential differences on the LTEM substrate 102 caused by the incident radiation beam $L_I$.

Figure 12:
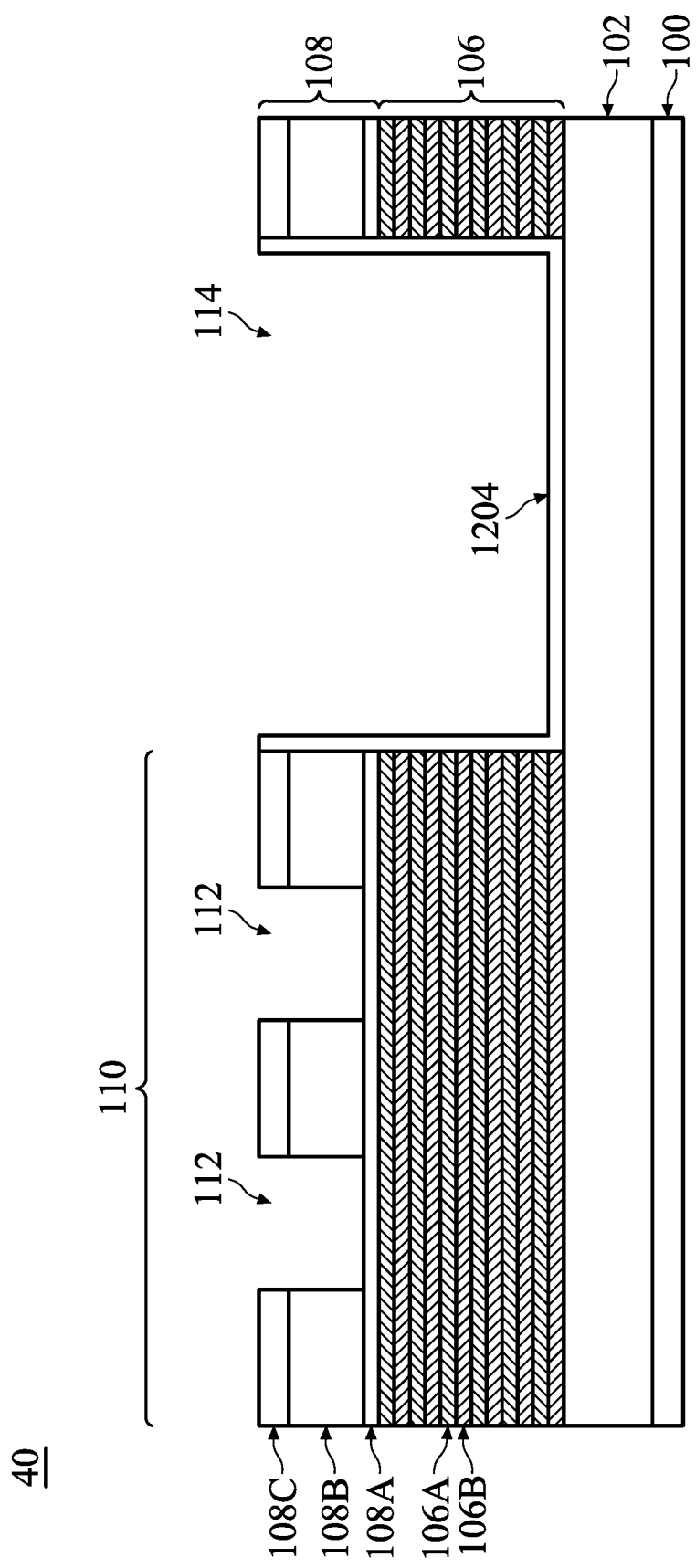
FIG. 12 illustrates a mask, in accordance with some other embodiments.

FIG. 12 illustrates the mask 40, in accordance with some other embodiments. In the embodiment shown in FIG. 12, the conductive film stack 104 is omitted, and the reflective film stack 106 is formed on the LTEM substrate 102. A conductive film 1204 is conformally formed along sides of the trenches 114. The conductive film 1204 may be formed by appropriate photolithography and deposition techniques. A photoresist may be formed over the mask 40, and may be patterned with openings corresponding to the trenches 114. The photoresist may be the same photoresist used to etch the trenches 114. The conductive film 1204 may then be formed extending along sides and the bottom of the trenches 114. Excess conductive film 1204 and the photoresist may then be removed by a planarization process, such as a chemical-mechanical polish (CMP), a grinding, or the like. The conductive film 1204 may be formed of TaBN, TaBO, the like, or combinations thereof, and may be formed by a deposition process such as CVD, ALD, PEALD, PVD, or the like.

Figure 13:
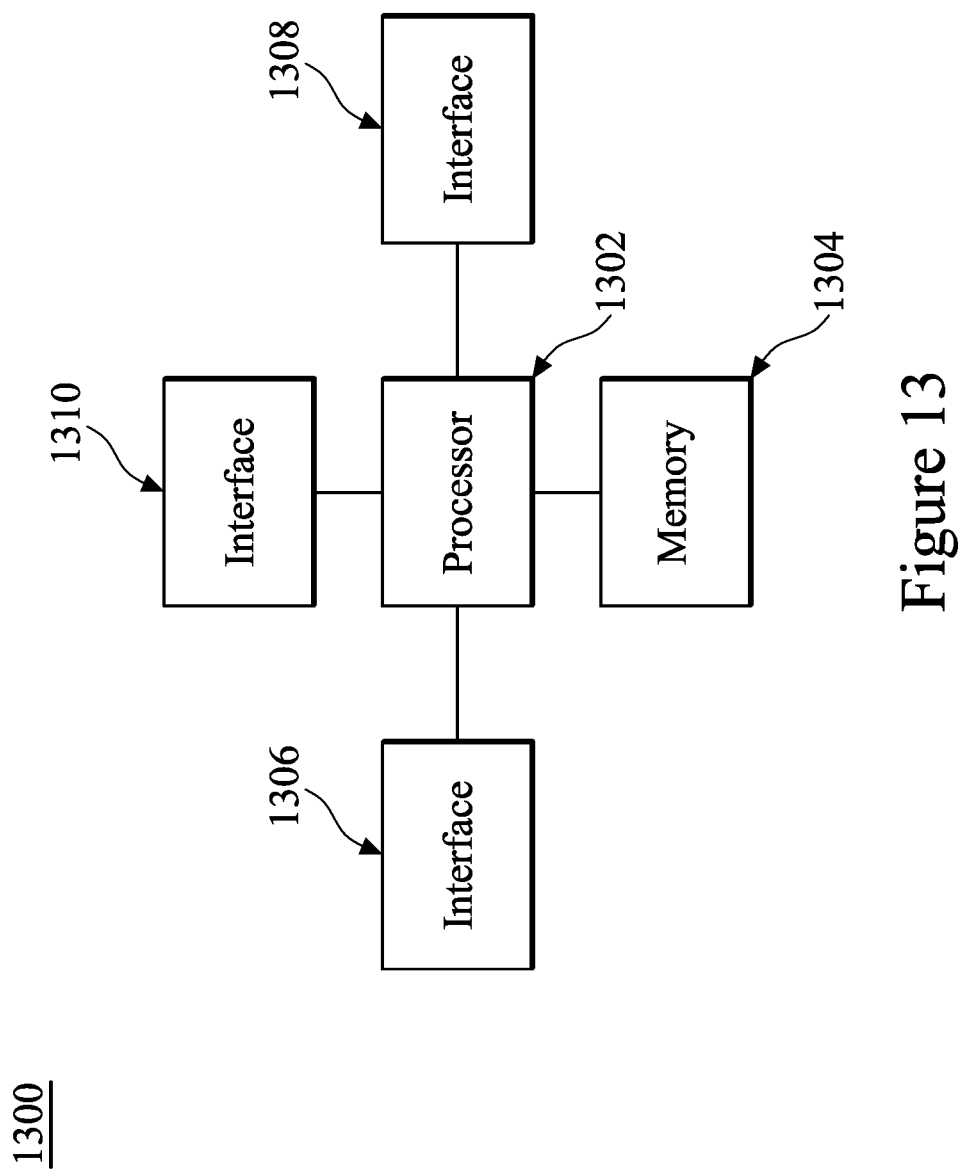
FIG. 13 is a block diagram of a processing system, in accordance with some embodiments.

FIG. 13 is a block diagram of a processing system 1300, in accordance with some embodiments. The processing system 1300 may be installed in a host device, such as the lithography system 10, and may be used for performing methods described herein, such as methods for adjusting the illuminator 30, moving the target substrate stage 62, and moving the chuck that holds the mask 40. As shown, the processing system 1300 includes a processor 1302, a memory 1304, and interfaces 1306-1310, which may (or may not) be arranged as shown in FIG. 13. The processor 1302 may be any component or collection of components adapted to perform computations and/or other processing related tasks, and the memory 1304 may be any component or collection of components adapted to store programming and/or instructions for execution by the processor 1302. In an embodiment, the memory 1304 includes a non-transitory computer readable medium. The interfaces 1306, 1308, 1310 may be any component or collection of components that allow the processing system 1300 to communicate with other devices/components and/or a user. For example, one or more of the interfaces 1306, 1308, 1310 may be adapted to communicate data, control, or management messages from the processor 1302 to applications installed on the host device and/or a remote device. As another example, one or more of the interfaces 1306, 1308, 1310 may be adapted to allow a user or user device (e.g., personal computer (PC), etc.) to interact/communicate with the processing system 1300. The processing system 1300 may include additional components not depicted in FIG. 13, such as long term storage (e.g., non-volatile memory, etc.).

Embodiments may achieve advantages. Forming one or more conductive layers at the bottom of the trenches 114 may neutralize potential differences on the surfaces of the mask 40 caused by partial illumination with the incident radiation beam $L_I$, such as that caused by shadows cast by features on the masks 40. Reducing differences in potential on the surfaces of the mask 40 may avoid arcing, thereby reducing the quantity of Mo particles that are discharged from the reflective film stack 106. This may improve the accuracy of the design layout pattern transferred to the target 60.

In an embodiment, a photomask includes: a substrate over a first conductive layer, the substrate formed of a low thermal expansion material (LTEM); a second conductive layer over the first conductive layer; a reflective film stack over the substrate; a capping layer over the reflective film stack; an absorption layer over the capping layer; and an antireflection (ARC) layer over the absorption layer, where the ARC layer and the absorption layer have a plurality of openings in a first region exposing the capping layer, where the ARC layer, the absorption layer, the capping layer, and the reflective film stack have a trench in a second region exposing the second conductive layer.

In some embodiments, the photomask further includes: a conductive film stack between the substrate and the reflective film stack, the conductive film stack including a plurality of conductive layers, the plurality of conductive layers including the second conductive layer. In some embodiments, a bottommost layer of the reflective film stack physically contacts a topmost layer of the conductive film stack. In some embodiments, a bottommost layer of the reflective film stack physically contacts the substrate. In some embodiments, the second conductive layer is a doped region in a top surface of the substrate, the doped region being doped with B or P. In some embodiments, the second conductive layer is disposed along a top surface of the substrate, and along sides of the reflective film stack, the capping layer, the absorption layer, and the ARC layer. In some embodiments, the trench surrounds the first region. In some embodiments, the reflective film stack includes alternating layers of a first material and a second material, the first material having a higher refractive index than the second material. In some embodiments, the reflective film stack has from 20 to 80 pairs of the first and second materials, the first material is Si, and the second material is Mo. In some embodiments, the second conductive layer and the absorption layer are formed of the same material. In some embodiments, the second conductive layer includes B or P.

In an embodiment, a photomask includes: a first conductive layer over a second conductive layer; a reflective film stack over the first conductive layer, the reflective film stack including alternating layers of a first material and a second material, the first material having a higher refractive index than the second material; a capping layer over the reflective film stack; an absorption layer over the capping layer; and an antireflection (ARC) layer over the absorption layer, where the ARC layer and the absorption layer have a plurality of openings exposing the capping layer, where the ARC layer, the absorption layer, the capping layer, and the reflective film stack have a trench exposing the first conductive layer and surrounding the openings.

In some embodiments, the photomask further includes: a conductive film stack over the first conductive layer, the conductive film stack including a plurality of conductive layers, the plurality of conductive layers including the first conductive layer, where the reflective film stack is disposed over the conductive film stack. In some embodiments, portions of the first conductive layer exposed by the trench are absorptive.

In an embodiment, a method includes: forming a first conductive layer over a substrate; forming a reflective film stack over the substrate, the reflective film stack including alternating layers of a first material and a second material, the first material having a higher refractive index than the second material; depositing a capping layer over the reflective film stack; depositing an absorption layer over the capping layer; depositing an antireflection (ARC) layer over the absorption layer; patterning a plurality of first openings extending through the ARC layer and the absorption layer; and patterning a trench extending through the ARC layer, the absorption layer, the capping layer, and the reflective film stack, where the trench surrounds the first openings and exposes the first conductive layer.

In some embodiments, forming the reflective film stack over the substrate includes forming the reflective film stack over the first conductive layer. In some embodiments, the method further includes: forming a photoresist over the ARC layer; patterning the photoresist with a second opening; etching the ARC layer, the absorption layer, the capping layer, and the reflective film stack using the patterned photoresist as an etching mask to form the trench; implanting dopants in the substrate using the patterned photoresist as an implantation mask to form the first conductive layer; and removing the patterned photoresist. In some embodiments, the method further includes: forming a photoresist over the ARC layer; patterning the photoresist with a second opening; etching the ARC layer, the absorption layer, the capping layer, and the reflective film stack using the patterned photoresist as an etching mask to form the trench; depositing the first conductive layer over the photoresist and in the trench; and removing the patterned photoresist and portions of the first conductive layer over the photoresist. In some embodiments, portions of the first conductive layer exposed by the trench are non-reflective. In some embodiments, the method further includes: projecting a radiation beam toward the reflective film stack such that the radiation beam is reflected from the reflective film stack and onto a photosensitive material, the radiation beam having a pattern corresponding to the pattern of the first openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photomask comprising:
    a first conductive layer;
    a conductive feature over the first conductive layer, the conductive feature being different from the first conductive layer;
    a reflective film stack over the conductive feature, the reflective film stack comprising alternating layers of a first material and a second material, the first material having a higher refractive index than the second material; and
    an absorptive film stack over the reflective film stack, wherein the absorptive film stack has first openings exposing the reflective film stack, and wherein the absorptive film stack and the reflective film stack have a second opening exposing the conductive feature, the second opening surrounding the first openings.

2. The photomask of claim 1, wherein the conductive feature comprises second conductive layers, and further comprising:
    a substrate disposed between the first conductive layer and the second conductive layers, the substrate being a low thermal expansion material (LTEM).

3. The photomask of claim 2, wherein each of the second conductive layers are TaBN, TaBO, TaBON, CrN, CrON, CrO, ITO, or TaO.

4. The photomask of claim 1, wherein the conductive feature comprises a second conductive layer, the second conductive layer being disposed between and in physical contact with the first conductive layer and the reflective film stack.

5. The photomask of claim 4, wherein the second conductive layer is a doped semiconductor substrate.

6. The photomask of claim 1, wherein the conductive feature comprises:
    a doped semiconductor substrate; and metal layers disposed between the doped semiconductor substrate and the reflective film stack.

7. The photomask of claim 1 further comprising:
a substrate disposed between the first conductive layer and the reflective film stack, the conductive feature being a doped region in the substrate, the reflective film stack being disposed over undoped regions of the substrate.

8. A photomask comprising:
a first conductive layer;
a substrate over the first conductive layer, the substrate being a low thermal expansion material (LTEM);
a reflective film stack over the substrate, the reflective film stack comprising alternating layers of a first material and a second material, the first material having a higher refractive index than the second material;
an absorptive film stack over the reflective film stack, wherein the absorptive film stack has first openings exposing the reflective film stack, and wherein the absorptive film stack and the reflective film stack have a second opening, the second opening surrounding the first openings; and
a conductive film disposed in the second opening, the conductive film contacting a major surface of the substrate, sidewalls of the absorptive film stack, and sidewalls of the reflective film stack.

9. The photomask of claim 8, wherein the conductive film is TaBN or TaBO.

10. The photomask of claim 8, wherein the conductive film is non-reflective.

11. The photomask of claim 8, wherein the reflective film stack has from 20 to 80 pairs of the first material and the second material, the first material being silicon, the second material being molybdenum.

12. The photomask of claim 8, wherein the absorptive film stack comprises:
a capping layer over the reflective film stack;
an absorption layer over the capping layer; and
an antireflection (ARC) layer over the absorption layer.

13. A method comprising:
forming photomask comprising:
a conductive feature;
a reflective film stack comprising alternating layers of a first material and a second material, the first material having a higher refractive index than the second material; and an absorptive film stack over the reflective film stack, wherein the absorptive film stack has first openings exposing the reflective film stack, and wherein the absorptive film stack and the reflective film stack have a second opening exposing the conductive feature, the second opening surrounding the first openings;
patterning a photosensitive layer using the photomask as a lithography mask; and
etching a target substrate using the patterned photosensitive layer as an etch mask.

14. The method of claim 13, wherein patterning the photosensitive layer comprises:
projecting a radiation beam toward the reflective film stack such that the radiation beam is reflected from portions of the reflective film stack exposed by the first openings, wherein the radiation beam is absorbed by portions of the conductive feature exposed by the second opening.

15. The method of claim 13 further comprising:
manufacturing an integrated circuit with the target substrate.

16. The method of claim 13 further comprising:
forming the conductive feature;
forming the reflective film stack on the conductive feature; and
forming the absorptive film stack on the reflective film stack.

17. The method of claim 13 further comprising:
forming the reflective film stack on a substrate;
forming the absorptive film stack on the reflective film stack;
forming the second opening in the absorptive film stack and the reflective film stack, the second opening exposing the substrate; and
forming the conductive feature in the second opening.

18. The method of claim 17, wherein forming the conductive feature comprises:
forming a conductive film in the second opening.

19. The method of claim 17, wherein forming the conductive feature comprises:
implanting dopants in portions of the substrate exposed by the second opening.

20. The method of claim 13, wherein the conductive feature is non-reflective.

* * * * *